(12) United States Patent
Luthra et al.

(10) Patent No.: US 10,954,168 B2
(45) Date of Patent: Mar. 23, 2021

(54) CERAMIC MATRIX COMPOSITE ARTICLES AND METHODS FOR FORMING SAME

(71) Applicant: General Electric Company, Schenectady, NY (US)

(72) Inventors: Krishan Lal Luthra, Niskayuna, NY (US); Gregory Scot Corman, Ballston Lake, NY (US); Badri Narayan Ramamurthi, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 190 days.

(21) Appl. No.: 16/138,725

(22) Filed: Sep. 21, 2018

(65) Prior Publication Data

US 2019/0023617 A1  Jan. 24, 2019

Related U.S. Application Data

(62) Division of application No. 14/632,030, filed on Feb. 26, 2015, now Pat. No. 10,093,586.

(51) Int. Cl.
 *C04B 35/08* (2006.01)
 *C04B 35/80* (2006.01)
 (Continued)

(52) U.S. Cl.
 CPC ............ *C04B 35/806* (2013.01); *B05D 3/108* (2013.01); *B32B 5/024* (2013.01); *B32B 5/18* (2013.01); *B32B 7/02* (2013.01); *C04B 35/573* (2013.01); *C23C 16/0227* (2013.01); *C23C 16/045* (2013.01); *B32B 2262/105* (2013.01); *B32B 2305/076* (2013.01); *B32B 2603/00* (2013.01); *C04B 2235/3826* (2013.01); *C04B 2235/422* (2013.01); *C04B 2235/428* (2013.01);

(Continued)

(58) Field of Classification Search
 CPC ....... C04B 35/573; C04B 35/806; B32B 5/18; B32B 5/024; B32B 7/02
 USPC ................................................... 428/446, 698
 See application file for complete search history.

(56) References Cited

U.S. PATENT DOCUMENTS 4,921,405 A  5/1990  Wilson
5,486,379 A  1/1996  Bouillon et al.
(Continued)

FOREIGN PATENT DOCUMENTS

EP  0798280 A2  10/1997
EP  2248786 A1  11/2010
(Continued)

OTHER PUBLICATIONS

Canadian Office Action issued in connection with Related CA Application No. 2920513 dated Dec. 21, 2016.
(Continued)

*Primary Examiner* — Archene A Turner
(74) *Attorney, Agent, or Firm* — Dority & Manning, P.A.

(57) ABSTRACT

A ceramic matrix composite article includes a melt infiltration ceramic matrix composite substrate comprising a ceramic fiber reinforcement material in a ceramic matrix material having a free silicon proportion, and a chemical vapor infiltration ceramic matrix composite outer layer comprising a ceramic fiber reinforcement material in a ceramic matrix material having essentially no free silicon proportion disposed on an outer surface of at least a portion of the substrate.

16 Claims, 5 Drawing Sheets

(51) Int. Cl.

| | | |
|---|---|---|
| *C04B 35/573* | (2006.01) | |
| *B32B 5/02* | (2006.01) | |
| *B32B 7/02* | (2019.01) | |
| *C23C 16/02* | (2006.01) | |
| *C23C 16/04* | (2006.01) | |
| *B05D 3/10* | (2006.01) | |
| *B32B 5/18* | (2006.01) | |

(52) U.S. Cl.
CPC ............ *C04B 2235/5244* (2013.01); *C04B 2235/5268* (2013.01); *C04B 2235/614* (2013.01); *C04B 2235/616* (2013.01); *C04B 2235/721* (2013.01); *C04B 2235/728* (2013.01); *C04B 2235/96* (2013.01); *C04B 2235/9607* (2013.01)

(56) References Cited

U.S. PATENT DOCUMENTS

| | | | |
|---|---|---|---|
| 5,846,054 A | 12/1998 | Mannava et al. | |
| 5,990,025 A * | 11/1999 | Suyama | C04B 35/573 |
| | | | 428/570 |
| 6,221,475 B1 | 4/2001 | Demergue et al. | |
| 6,274,078 B1 | 8/2001 | Dunyak et al. | |
| 6,723,382 B2 | 4/2004 | Yamaguchi et al. | |
| 6,733,907 B2 | 5/2004 | Morrison et al. | |
| 7,378,362 B2 | 5/2008 | Nixon et al. | |
| 7,687,016 B1 | 3/2010 | DiCarlo et al. | |
| 7,708,851 B2 | 5/2010 | Corman et al. | |
| 8,043,720 B2 | 10/2011 | Corman et al. | |
| 8,426,326 B2 | 4/2013 | Bouillon et al. | |
| 8,529,995 B2 | 9/2013 | Eberling-Fux et al. | |
| 9,975,815 B2 | 5/2018 | Steibel | |
| 1,009,423 A1 | 10/2018 | Luihra | |
| 2005/0084379 A1 | 4/2005 | Schreiber | |
| 2005/0158171 A1 | 7/2005 | Carper et al. | |
| 2006/0163773 A1 | 7/2006 | Gray | |
| 2007/0092762 A1 | 4/2007 | Corman et al. | |
| 2007/0202314 A1 | 8/2007 | Youn et al. | |
| 2009/0016890 A1 | 1/2009 | Douguet et al. | |
| 2009/0020797 A1 | 1/2009 | Wang | |
| 2010/0021713 A1 | 1/2010 | Lane et al. | |
| 2010/0129673 A1 * | 5/2010 | Lee | C04B 41/5027 |
| | | | 428/446 |
| 2010/0279845 A1 * | 11/2010 | Kebbede | C04B 35/62873 |
| | | | 501/88 |
| 2011/0219775 A1 | 9/2011 | Jarmon et al. | |
| 2011/0229337 A1 | 9/2011 | Carper et al. | |
| 2012/0076927 A1 | 3/2012 | Bhatt et al. | |
| 2013/0004325 A1 | 1/2013 | McCaffrey et al. | |
| 2013/0062000 A1 | 3/2013 | Roberts, III et al. | |
| 2013/0167374 A1 | 7/2013 | Kirby et al. | |
| 2014/0255665 A1 | 9/2014 | Hillier et al. | |
| 2014/0271161 A1 | 9/2014 | Lazur | |
| 2015/0004393 A1 | 1/2015 | Pegna et al. | |

FOREIGN PATENT DOCUMENTS

| | | |
|---|---|---|
| JP | H10152378 A | 6/1998 |
| JP | H1130103 A | 2/1999 |
| JP | 2001/505863 A | 5/2001 |
| JP | 2007/119333 A | 5/2007 |
| WO | WO2013/171770 A1 | 11/2013 |
| WO | WO2014/011242 A2 | 1/2014 |
| WO | WO201/143364 A2 | 9/2014 |
| WO | WO2014/138108 A1 | 9/2014 |

OTHER PUBLICATIONS

First Chinese Office Action Corresponding to CN Application No. 2016101062733 dated Feb. 9, 2018.

Extended European Search Report and Opinion issued in connection with corresponding EP Application No. 16155969.5 dated Jul. 15, 2016.

European Search Report & Opinion issued in connection with Related EP Application No. 161571831 dated Jul. 18, 2016.

Curtain et al., CNT-reinforced Ceramics and Metals, Elsevier Materials Today, Nov. 2004, pp. 44-49.

Fan et al., Micro Structures and Properties of 3D Needle-Punched Carbon/silicon Carbide Brake Materials, Science Direct, Composites Science and Technology, vol. 67, 2007, pp. 2390-2398.

Gonon et al., Comparison of Two Processes for Manufacturing Ceramic Matrix Composites from Organometallic Precursors, Journal of the European Ceramic Society, vol. 19, 1999, pp. 285-291.

Hillig et al., Melt Infiltration Approach to Ceramic Matrix Composites, J. Am. Ceram. Soc., vol. 71, Issue 2, Feb. 1988, pp. C-96 to C-99.

Kim et al., Niealon-Fibre-Reinforced Silicon-Carbide Composites via Polymer Solution Infiltration and Chemical Vapour Infiltration, Journal of Materials Science, vol. 28, Issue 14, London, Jul. 15, 1992, pp. 3866-3868.

Naslain et al., The CVI-Processing of Ceramic Matrix Composites, Journal de Physique, Colloques C5, 50, 1989, pp. C5-191 to C5-207.

Xu et al. Carbon/Silicon Carbide Composites Prepared by Chemical Vapor Infiltration Combined with Silicon Melt Infiltration, Carbon Elsevier; vol. 37, 1999, pp. 1179-1187.

Machine Translated Japanese Office Action Corresponding to Application No. 2016028973 dated Jan. 31, 2020.

* cited by examiner

CERAMIC MATRIX COMPOSITE ARTICLES AND METHODS FOR FORMING SAME

CROSS-REFERENCE TO RELATED APPLICATION

This application is related to commonly assigned, co-filed patent application Ser. No. 14/632,333, filed, Feb. 26, 2015, by Steibel et al. and entitled "Ceramic Matrix Composite Articles And Methods For Forming Same", which is hereby incorporated herein in its entirety by reference.

TECHNICAL FIELD

The present disclosure generally relates to ceramic matrix composites (CMC), and more particularly, to articles and methods for forming ceramic matrix composite articles.

BACKGROUND

Ceramic matrix composites generally include a ceramic fiber reinforcement material embedded in a ceramic matrix material. The reinforcement material serves as the load-bearing constituent of the CMC in the event of a matrix crack, while the ceramic matrix protects the reinforcement material, maintains the orientation of its fibers, and serves to dissipate loads to the reinforcement material. Of particular interest to high-temperature applications, such as in gas turbines, are silicon-based composites, which include silicon carbide (SiC) as the matrix and/or reinforcement material.

Different processing methods have been employed in forming CMCs. For example, one approach includes melt infiltration (MI), which employs a molten silicon to infiltrate into a fiber-containing perform. CMCs formed by prepreg MI are generally fully dense, e.g., having generally zero, or less than 3 percent by volume, residual porosity. This very low porosity gives the composite desirable mechanical properties, such as a high proportional limit strength and inter-laminar tensile and shear strengths, high thermal conductivity and good oxidation resistance. However, the matrices of MI composites contain a free silicon phase (i.e. elemental silicon or silicon alloy) that limits the use temperature of the system to below that of the melting point of the silicon or silicon alloy, or about 2550 degrees Fahrenheit to 2570 degrees Fahrenheit. Moreover the free silicon phase caused the MI SiC matrix to have relatively poor creep resistance.

Another approach for forming CMCs is chemical vapor infiltration (CVI). CVI is a process whereby a matrix material is infiltrated into a fibrous preform by the use of reactive gases at elevated temperature to form the fiber-reinforced composite. Generally, limitations introduced by having reactants diffuse into the preform and by-product gases diffusing out of the perform result in relatively high residual porosity of between about 10 percent and about 15 percent in the composite. In particular, typically in forming CMCs using CVI, the inner portion of the composite formed by CVI typically has a higher porosity than the porosity of the outer portion of the composite. The presence of this porosity degrades the in-plane and through-thickness mechanical strength, thermal conductivity, and oxidation resistance of the CVI CMC relative to MI CMCs. However, CVI composite matrices typically have no free silicon phase, and thus have better creep resistance than MI matrices and the potential to operate at temperatures above 2570 degrees Fahrenheit.

Another approach for forming CMCs includes initially employing a partial CVI process followed by a MI process, and is generally referred to as "slurry cast MI". This approach usually yields an intermediate porosity between that of MI composites and CVI composites, generally of between about 5 percent and about 7 percent, and yields residual free silicon phase within the composite matrix.

There is a need for further ceramic matrix composites (CMC), and more particularly, to articles and methods for forming ceramic matrix composite articles.

SUMMARY

The present disclosure provides, in a first aspect, a ceramic matrix composite article, which includes a melt infiltration ceramic matrix composite substrate comprising a ceramic fiber reinforcement material in a ceramic matrix material having a free silicon proportion, a chemical vapor infiltration ceramic matrix composite outer layer comprising a ceramic fiber reinforcement material in a ceramic matrix material having no free silicon proportion disposed on an outer surface of at least a portion of the substrate.

The present disclosure provides, in a second aspect, a method for forming a ceramic matrix composite article. The method includes forming by melt infiltration a ceramic matrix composite substrate comprising a ceramic fiber reinforcement material in a ceramic matrix material having a free silicon proportion, and forming by chemical vapor infiltration a ceramic matrix composite outer layer comprising a ceramic fiber reinforcement material in a ceramic matrix material having no free silicon disposed on at least a portion of the substrate.

DRAWINGS

The foregoing and other features, aspects and advantages of this disclosure will become apparent from the following detailed description of the various aspects of the disclosure taken in conjunction with the accompanying drawings, wherein:

FIG. 1 is a cross-sectional view of a ceramic matrix composite article in accordance with aspects of the present disclosure having a ceramic matrix composite substrate and a ceramic matrix composite outer layer;

FIG. 2 cross-sectional view of the ceramic matrix composite substrate of the ceramic matrix composite article of FIG. 1;

DETAILED DESCRIPTION

Figure 1:
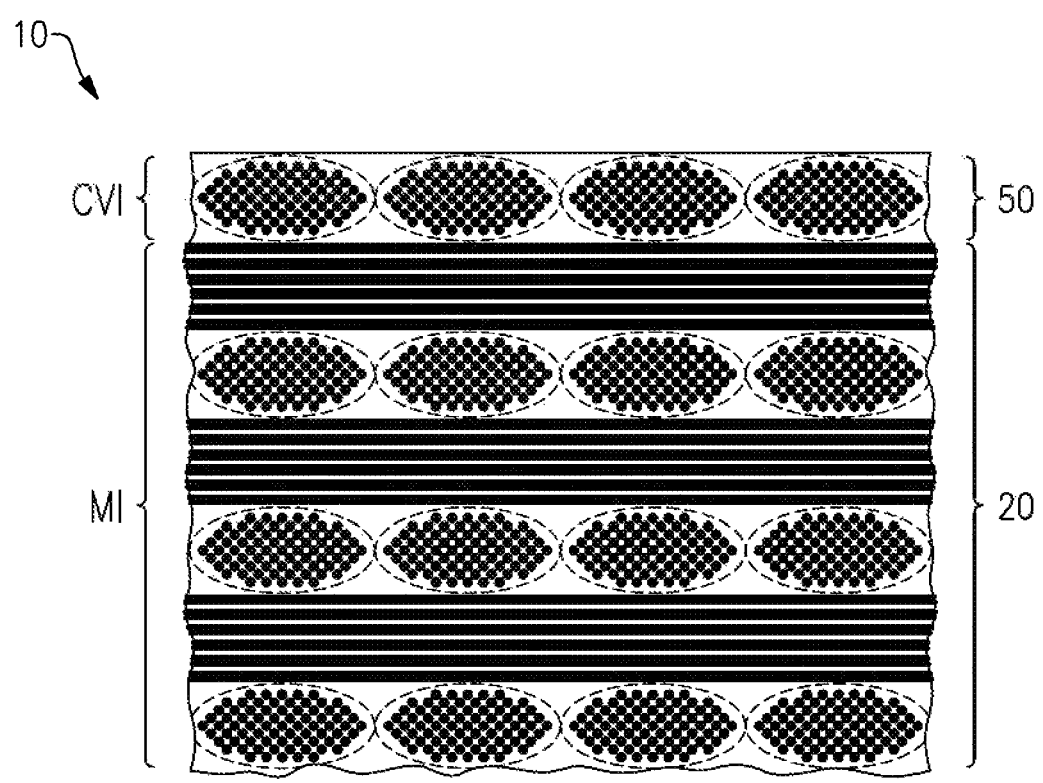

The detailed description facilitates the explanation of certain aspects of the disclosure, and should not be interpreted as limiting the scope of the disclosure. Moreover, approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. When introducing elements of various embodiments, the articles "a," "an," "the," and "said" are intended to mean that there are one or more of the elements. The terms "comprising," "including," and "having" are intended to be inclusive and mean that there may be additional elements other than the listed elements. As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable. Any examples of operating parameters are not exclusive of other parameters of the disclosed embodiments. Components, aspects, features, configurations, arrangements, uses and the like described, illustrated or otherwise disclosed herein with respect to any particular embodiment may similarly be applied to any other embodiment disclosed herein.

Generally, the present disclosure is directed to a ceramic matrix composite (CMC) articles having generally good mechanical properties such as tensile and compressive strength, along with increased creep resistance such as resistance to deformation or change in shape over time due to stress, and increased temperature capability. For example, a CMC article may include a CMC substrate and an outer CMC skin or layer. The CMC substrate and the outer CMC skin or layer may have different properties allowing tailoring of the CMC article to result in a CMC article having generally good mechanical properties with increased creep resistance (resistance to deformation or change in shape over time due to stress) and increased temperature capability. The technique of the present disclosure results in both the CMC substrate and the CMC outer layer being CMCs having a reinforcing material, and thus both the CMC substrate and the CMC outer layer offering mechanical properties such as tensile and compressive strength. In addition, the CMC outer layer may also offer increased creep resistance and increased temperature capability to the CMC article. Such a technique of the present disclosure may be advantageous in CMC components where surface stresses are high and where creep is typically a problem, or where high temperatures are experienced. For example, many turbine components have thermal and mechanical stresses that simulate a bending condition. In bending, the in-plane stresses are highest at the surfaces. Thus, placing a more creep resistant material with higher temperature capability on the surface may improve the creep response and the thermal capability of the structure as a whole.

FIG. 1 illustrates a CMC article 10 having a CMC substrate 20 and a CMC skin or outer layer 50 in accordance with aspects of the present disclosure. As described in greater detail below, CMC substrate 20 may include a ceramic fiber reinforcement material in a ceramic matrix material having a free silicon content or proportion (e.g., the amount of elemental silicon or silicon alloy relative to the substrate as a whole). Herein the term free silicon refers to the presence of elemental silicon or silicon alloy where silicon makes up greater than about 33 atomic percent of the alloy. CMC outer layer 50 may include a ceramic fiber reinforcement material in a ceramic matrix material disposed on an outer surface of at least a portion of the CMC substrate. CMC outer layer 50 includes no free silicon content or proportion. CMC substrate 20 may be a silicon-rich silicon carbide substrate having, for example, free silicon (e.g., about 5 percent, 10 percent, 15 percent, 20 percent, 30 percent, or greater free silicon by volume of elemental silicon or silicon alloy phase). CMC substrate 20 may have generally full density, or none or little porosity (e.g., about 0 percent, less than 5 percent, between about 0 and less than 5 percent). CMC outer layer 50 may contain generally no or zero free silicon content silicon carbide, or slightly carbon rich silicon carbide. CMC substrate 20 may be formed by a first process and CMC outer layer 50 may be formed by a second process different from the first process. For example, the CMC substrate may be formed by using a melt infiltration process, and the outer layer be formed using a chemical vapor infiltration process. Outer layer 50 may have better creep resistance than substrate 20 and may result in CMC article 10 having a creep resistance greater than a creep resistance of a CMC article not having outer layer 50. CMC outer layer 50 which has no free elemental silicon or silicon alloy may withstand higher temperature (e.g., higher than the melting point of silicon) compared to CMC substrate 20 (which may include free silicon) and may result in CMC article 10 that can withstand temperatures greater than that of a CMC article not having outer layer 50.

Figure 2:
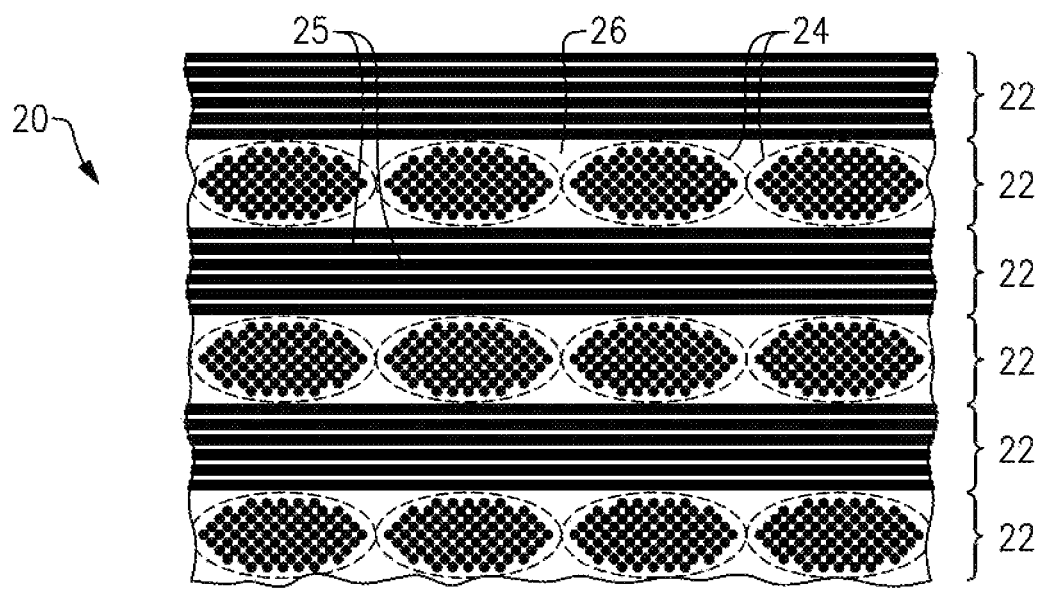

With reference to FIG. 2, CMC article 10 (FIG. 1) may include initially forming CMC substrate 20. A surface region of CMC substrate 20 may include multiple laminae 22, each derived from an individual prepreg that includes unidirectionally-aligned tows 24 impregnated with a ceramic matrix precursor. As a result, each lamina 22 contains unidirectionally-aligned fibers 25 encased in a ceramic matrix 26 formed by conversion of the ceramic matrix precursor during firing and melt infiltration.

For example, CMC substrate 20 may be fabricated from multiple layers of "prepreg," often in the form of a tape-like structure, comprising the reinforcement material of the desired CMC impregnated with a precursor of the CMC matrix material. The prepreg may undergo processing (including firing) to convert the precursor to the desired ceramic. The prepregs may be continuous fiber reinforced ceramic composite (CFCC) materials and may include a two-dimensional fiber array comprising a single layer of unidirectionally-aligned tows impregnated with a matrix precursor to create a generally two-dimensional laminate. Multiple plies of the resulting prepregs are stacked and debulked to form a laminate preform, a process referred to as "lay-up." The prepregs are typically arranged so that tows of the prepreg layers are oriented transverse (e.g., perpendicular) or at an angle to each other, providing greater strength in the laminar plane of the preform (corresponding to the principal (load-bearing) directions of the final CMC component).

Following lay-up, the laminate preform may undergo debulking and curing while subjected to applied pressure and an elevated temperature, such as in an autoclave. In the case of melt-infiltrated (MI), the debulked and cured preform undergoes additional processing. First, the preform may be heated in vacuum or in an inert atmosphere in order to decompose the organic binders, at least one of which pyrolyzes during this heat treatment to form a carbon char, and produces a porous preform for melt infiltration. Further heating, either as part of the same heat cycle as the binder burn-out step or in an independent subsequent heating step, the preform is melt infiltrated, such as with molten silicon supplied externally. The molten silicon infiltrates into the porosity, reacts with the carbon constituent of the matrix to form silicon carbide, and fills the porosity to yield the desired CMC substrate.

Figure 3:
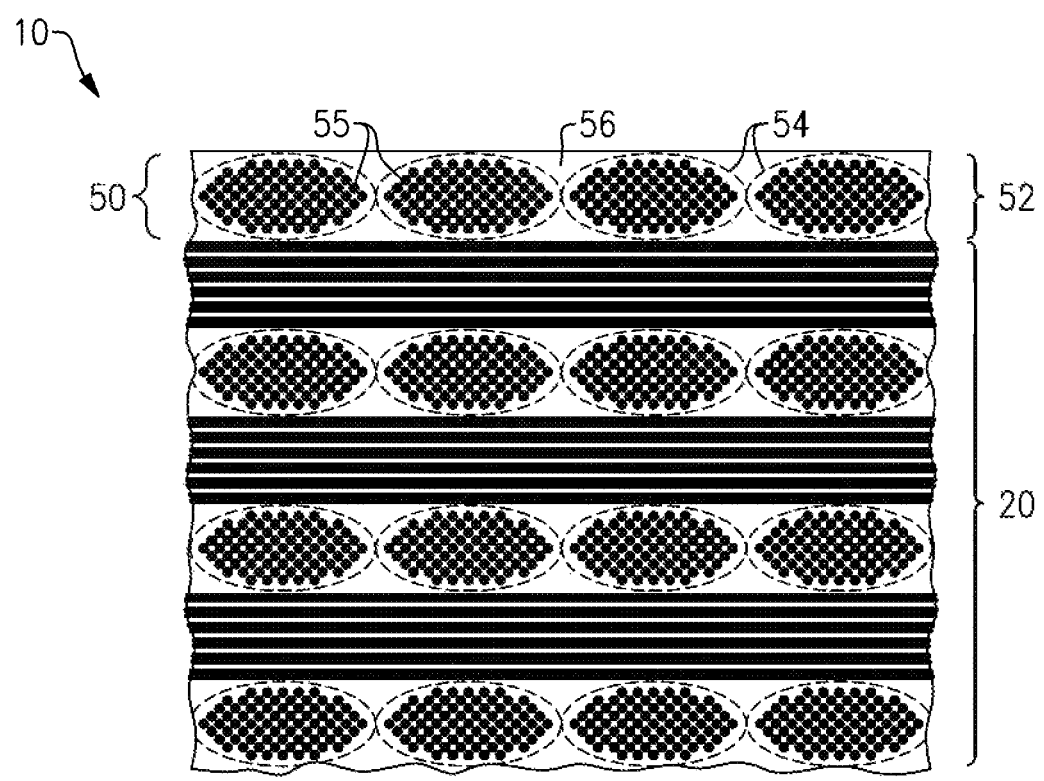
FIG. 3 is a cross-sectional view of the ceramic matrix composite substrate of FIG. 2 with the ceramic matrix composite outer layer.

With reference to FIG. 3, CMC article 10 may include forming outer layer 50 on initially formed CMC substrate 20. For example, a lamina 52 may be derived from an individual prepreg that includes unidirectionally-aligned tows 54 impregnated with a ceramic matrix precursor. Lamina 52 contains unidirectionally-aligned fibers 55 encased in a ceramic matrix 56 formed by conversion of the ceramic matrix precursor during firing and chemical vapor infiltration (CVI).

For example, CMC outer layer 50 may be fabricated from a layer of "prepreg," often in the form of a sheet-like structure, comprising the reinforcement material of the desired CMC impregnated with a precursor of the CMC matrix material. The prepreg undergoes processing (including firing) to convert the precursor to the desired ceramic. The prepreg may be continuous fiber reinforced ceramic composite (CFCC) materials and may include a two-dimensional fiber array comprising a single layer of unidirectionally-aligned tows impregnated with a matrix precursor to create a generally two-dimensional laminate. Alternately the prepreg may comprise layers with woven fibers. A ply of the prepreg may be disposed on CMC substrate. The prepreg can be arranged so that tows of the prepreg layer are oriented parallel, transverse (e.g., perpendicular) or at an angle to the tows of the outermost layer of the CMC substrate.

The prepreg layer may undergo curing while subjected to applied pressure and an elevated temperature, such as in an autoclave or localized application of pressure and heat. In the case of chemical vapor infiltration (CVI), the cured preform undergoes additional processing. First, the prepreg layer disposed on the CMC substrate may be heated in vacuum or in an inert atmosphere in order to decompose the organic binders, at least one of which pyrolyzes during this heat treatment to form a ceramic char, and produces a porous layer for chemical vapor infiltration. Further heating, either as part of the same heat cycle as the binder burn-out step or in an independent subsequent heating step, the layer is chemical vapor infiltrated, such as with a gaseous source of silicon carbide supplied externally. Appropriate reactant gases and processing conditions for performance of the CVI process are well known in the art. The gaseous source of silicon carbide infiltrates into the porosity, reacts on the internal surfaces of the porous substrate to deposit SiC with no free Si metal.

Figure 4:
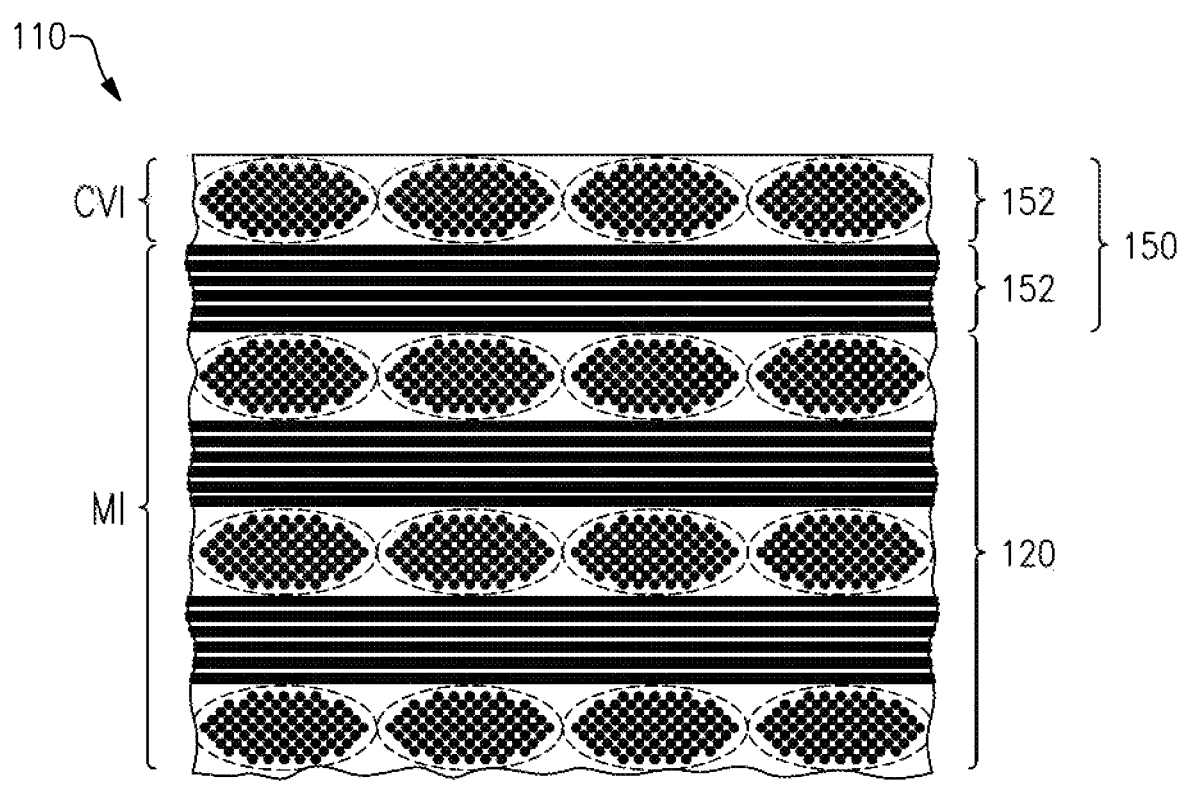
FIG. 4 is a cross-sectional view of a CMC article in accordance with aspects of the present disclosure having a ceramic matrix composite substrate and a ceramic matrix composite outer layer.

FIG. 4 illustrates a CMC article 110 having a CMC substrate 120 and a CMC skin or outer layer 150 in accordance with aspects of the present disclosure. CMC substrate 120 may include a ceramic fiber reinforcement material in a ceramic matrix material having a free silicon proportion or content, and CMC outer layer 150 may include a ceramic fiber reinforcement material in a ceramic matrix material disposed on an outer surface of at least a portion of the CMC substrate. CMC outer layer 150 may include essentially no free silicon proportion or content. For example, CMC substrate 120 may have generally full density, or none or little porosity (e.g., about 0 percent, less than 5 percent, or between about 0 and less than 5 percent). CMC substrate 120 may be a silicon-rich silicon carbide substrate having, for example, free silicon (e.g., about 5 percent, 10 percent, 15 percent, 20 percent, 30 percent, or greater free silicon by volume of elemental silicon or silicon alloy phase). CMC outer layer 150 may be generally pure silicon carbide, generally silicon carbide with no or zero free silicon content, or slightly carbon rich silicon carbide. CMC substrate 120 may be formed by a first process and CMC outer layer 150 may be formed by a second process different from the first process. For example, the CMC substrate may be formed by formed using a melt infiltration process, and the outer layer be formed using a chemical vapor infiltration process. Outer layer 150 having better creep resistance than substrate 120 may result in CMC article 110 having a creep resistance greater than a creep resistance of a CMC article not having outer layer 150. CMC outer layer 150 which may have no free elemental silicon or silicon alloy may withstand higher temperatures (e.g., higher than the melting point of silicon) compared to CMC substrate 120 (which may include free silicon) and may result in CMC article 110 that can withstand higher temperatures than that of a CMC article not having outer layer 150.

CMC article 110 may include initially forming CMC substrate 120 in a similar manner as noted above in connection with forming substrate 20 (FIG. 2). With reference still to FIG. 4, CMC article 110 may include forming outer layer 150 on initially formed CMC substrate 120. For example, outer layer 150 may include a plurality of laminae 152, each derived from an individual prepreg that includes unidirectionally-aligned tows impregnated with a ceramic matrix precursor. Each lamina 152 may contain unidirectionally-aligned fibers or woven fibers encased in a ceramic matrix formed by conversion of the ceramic matrix precursor during firing and chemical vapor infiltration (CVI).

For example, CMC outer layer 150 may be fabricated from a plurality of layers of "prepreg," often in the form of a tape-like structure, comprising the reinforcement material of the desired CMC impregnated with a precursor of the CMC matrix material. The prepreg undergoes processing (including firing) to convert the precursor to the desired ceramic. The prepregs may be continuous fiber reinforced ceramic composite (CFCC) materials and may include a two-dimensional fiber array comprising a single layer of unidirectionally-aligned tows impregnated with a matrix precursor to create a generally two-dimensional laminate. Alternately the prepreg may comprise layers with woven fibers. The plurality of plies of the resulting prepregs are stacked and debulked. The prepregs are typically arranged so that tows of the prepreg layers are oriented parallel to, transverse (e.g., perpendicular) to or at an angle to the tows of the outermost layer of the CMC substrate.

The plurality of layers may typically undergo debulking and curing while subjected to applied pressure and an elevated temperature, such as in an autoclave or localized application of pressure and heat. In the case of chemical vapor infiltration (CVI), the debulked and cured plurality of layers may undergo additional processing. First, the plurality of layers disposed on the CMC substrate may be heated in vacuum or in an inert atmosphere in order to decompose the organic binders, at least one of which pyrolyzes during this heat treatment to form a ceramic char, and produces a porous layer for chemical vapor infiltration. Further heating, either as part of the same heat cycle as the binder burn-out step or in an independent subsequent heating step, the porous layer is chemical vapor infiltrated, such as with gaseous source of silicon carbide supplied externally. The gaseous silicon carbide source infiltrates into the porosity, reacts to deposit SiC on the internal pore surfaces of the porous layer to form a silicon carbide composite layer having a lower free silicon content (e.g., preferably zero) than the substrate.

An alternate embodiment would be to place the MI composite substrate into a mold with a layer, or layers, of fiber plies occupying the space between the outer surface of the MI composite substrate and inner surface of the mold, and the structure subjected to CVI densification. The mold material would be compatible with the CVI process and would contain holes, or channels, that would allow for the inward diffusion of the reactant gases and outward diffusion of the reaction product gases. Such mold materials (such as carbon) and hole configurations are well known in the CVI art.

In the above embodiments, a material for the tows may be SiC fibers. An example of a material suitable for the tows is HI-NICALON® from Nippon Carbon Co., Ltd. A suitable range for the diameters of the fibers is about two to about twenty micrometers, though fibers with larger and smaller diameters are also within the scope of this disclosure. The fibers may be preferably coated with materials to impart certain desired properties to the CMC substrate and/or CMC outer layer, such as a carbon or boron nitride interface layer (not shown). The fibers in the outer layer may be coated prior to forming into the prepreg tapes and application to the MI CMC substrate, or the fiber coatings may be applied during the initial part of the CVI process. Those skilled in the art will appreciate that the teachings of this disclosure are also applicable to other CMC material combinations, and that such combinations are within the scope of this disclosure.

As described above, the CMC outer layer formed by a CVI process having generally no free silicon phase may result in the CMC outer layer having greater creep resistance and temperature capability than the CMC substrate formed by MI and having generally full density, or none or little porosity such as about 0 percent, less than 5 percent, or between about 0 and less than 5 percent. In addition, the CMC substrate such as formed by a silicon melt infiltration may result in a silicon-rich silicon carbide substrate having, for example, 5 percent, 10 percent, 15 percent, 20 percent, 30 percent, or greater free silicon by volume of elemental silicon or silicon alloy phase. The CMC outer layer may comprise generally pure silicon carbide, e.g., about 1 to 1 ratio of silicon to carbon, or slightly carbon rich such as a ratio of 0.995 silicon to 1.005 carbon. The thickness of the plies or unidirectional tape for forming the CMC article may be about 3 mils (0.003 inch) to about 20 mils (0.020 inch). The CMC article may be formed having a single ply or layer of reinforcement fibers, a plurality of plies or layers of reinforcement fibers, or multiple plies or layers of reinforcement fibers for forming the CMC outer layer. For example, the CMC article of the present disclosure may comprise a CMC substrate formed from about eight plies or layers of reinforcement fibers and melt infiltration, and an outer layer formed from one or two plies or layers of reinforcement fibers and chemical vapor infiltration so that the outer layer may be about 10 percent to about 25 percent of the thickness of the CMC article. In other embodiments of the ceramic matrix composite article, the outer layer may be about 5 percent to about 70 percent of the thickness of the ceramic matrix composite article. In other embodiments, the CMC article may have about 50 to about 100 plies. It will be appreciated that other configurations of the number of plies and thickness of the CMC substrate relative to the CMC outer layer are also possible.

While the CMC article may be formed from unidirectional prepreg tapes, it will be appreciated that woven prepreg tape may be employed to form the CMC substrate and/or the CMC outer layer. The aligned fibers in the unidirectional prepreg tape may result in fewer pores than that resulting from a prepreg woven fiber fabric. In addition, one or more additional layers or coatings may be formed on the CMC outer layer of the CMC article. For example, in some embodiments, an environmental barrier coating (EBC) may be formed on the outer layer.

In addition, the substrate may be formed by a slurry cast melt infiltration process, for example, employing a woven or braided fiber architecture which is formed to shape in a mold, the fiber interface coating applied by CVI followed by a portion of the matrix being deposited by CVI, slip or slurry casting of particulate SiC and/or C into the porosity of the partially densified body, and finally melt infiltration of the body with silicon or silicon alloy to fill in any remaining open porosity and react with carbon in the matrix.

In some embodiments, a CMC outer layer may be formed from, for example, a 10 mil ply so that the outer layer may have a thickness of about 0.01 inch, or two 5 mil plies so that the outer layer may have a thickness of about 0.01 inch thick, and once formed such as employing a CVI process may have a porosity of about 0 percent along the outer surface of the CMC outer layer. The porosity of the CMC outer layer may vary linearly or non-linear through the thickness of the CMC outer layer from the outer surface to the inner surface.

In some embodiments, CVI SiC ceramic matrix composite may be annealed at high temperatures such as over about 2,900 degrees Fahrenheit (about 1,600 degrees Celsius) to crystallize the SiC and increase its grain size. If so, the silicon from the substrate matrix may have to be initially removed and replaced with a SiC/Si3N4 matrix made by polymer impregnation pyrolysis (PIP) or infiltration of an oxide matrix or some other technique prior to CVI. In such a case, the overall process may involve forming a CMC substrate by melt infiltration, extracting the free silicon and possibly replacing it with SiC/Si3N4 or an oxide, followed application of the surface layers, processing by CVI, and then performing the final anneal.

In some embodiments, the CVI densification of the surface layer may be stopped prior to fully sealing off the outer surface and the remaining open porosity of the surface layer can then be infiltrated with an oxide material.

Figure 5:
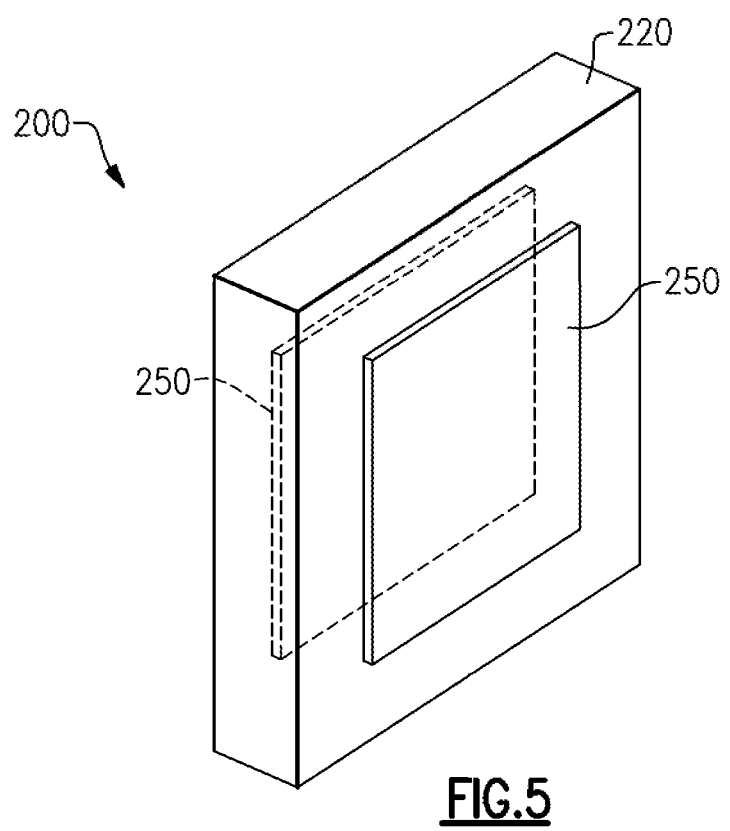
FIG. 5 is a perspective view of a CMC article in accordance with aspects of the present disclosure having a ceramic matrix composite substrate and a ceramic matrix composite outer layer.

FIG. 5 illustrates a CMC article 210 in accordance with aspects of the present disclosure having a ceramic matrix composite substrate 220 and opposite ceramic matrix composite outer layers 250. CMC outer layer 250 may extend over the entire CMC substrate or only over a portion of CMC substrate 220 such as on one side and on both sides of a substrate. Substrate 220 and outer layer 250 may be similarly formed and have the characteristics of substrate 20 (FIG. 3) and 120 (FIG. 4), and outer layer 50 (FIG. 3) and 150 (FIG. 4) as described above.

As noted above, generally CMC articles formed solely using uniform performs and melt infiltration have attractive features including a full density and mechanical properties. However, due to free silicon resulting from melt infiltration, at temperatures over about 2,400 degrees Fahrenheit (about 1,300 degrees Celsius), the creep resistance of the matrix is poor which manifests itself in poor creep rupture strength under tension and poor Sustained Peak Low Cycle Fatigue (SPLCF) strengths under compression. At temperatures over about 2,550 degrees Fahrenheit (about 1,400 degrees Celsius), the free silicon melts. CMC articles formed solely using chemical vapor infiltration contain significant porosity which leads to poor inter-laminar properties and poor oxidation resistance.

From the present description, it will be appreciated that the techniques of the present disclosure overcome the problems associated with CMC articles formed solely from a uniform preform using melt infiltration or by chemical vapor infiltration by providing a CMC skin or outer layer that offer increased creep resistance and/or increased temperature capability to the CMC article. The proposed technique of the present disclosure may increase the temperature limit of current MI ceramic matrix composites from about 2,400 degrees Fahrenheit (about 1,300 degrees Celsius) to temperatures above the melting temperature of silicon, approximately 2,577 degrees Fahrenheit (approximately 1,414 degrees Celsius). This may be possible where the article is used in a thermal gradient where the substrate is maintained below about 2,500 degrees Fahrenheit (about 1,370 degrees Celsius) but the outer surface is allowed to exceed this temperature, such as in a turbine shroud. This temperature capability may lead to reduction in Specific Fuel Consumption (SFC) of several percent for aircraft engines.

Such a technique of the present disclosure may be advantageous for application to silicon-bearing ceramic turbine components, for example, turbine blades, vanes, nozzles, shrouds, combustors, etc.

Figure 6:
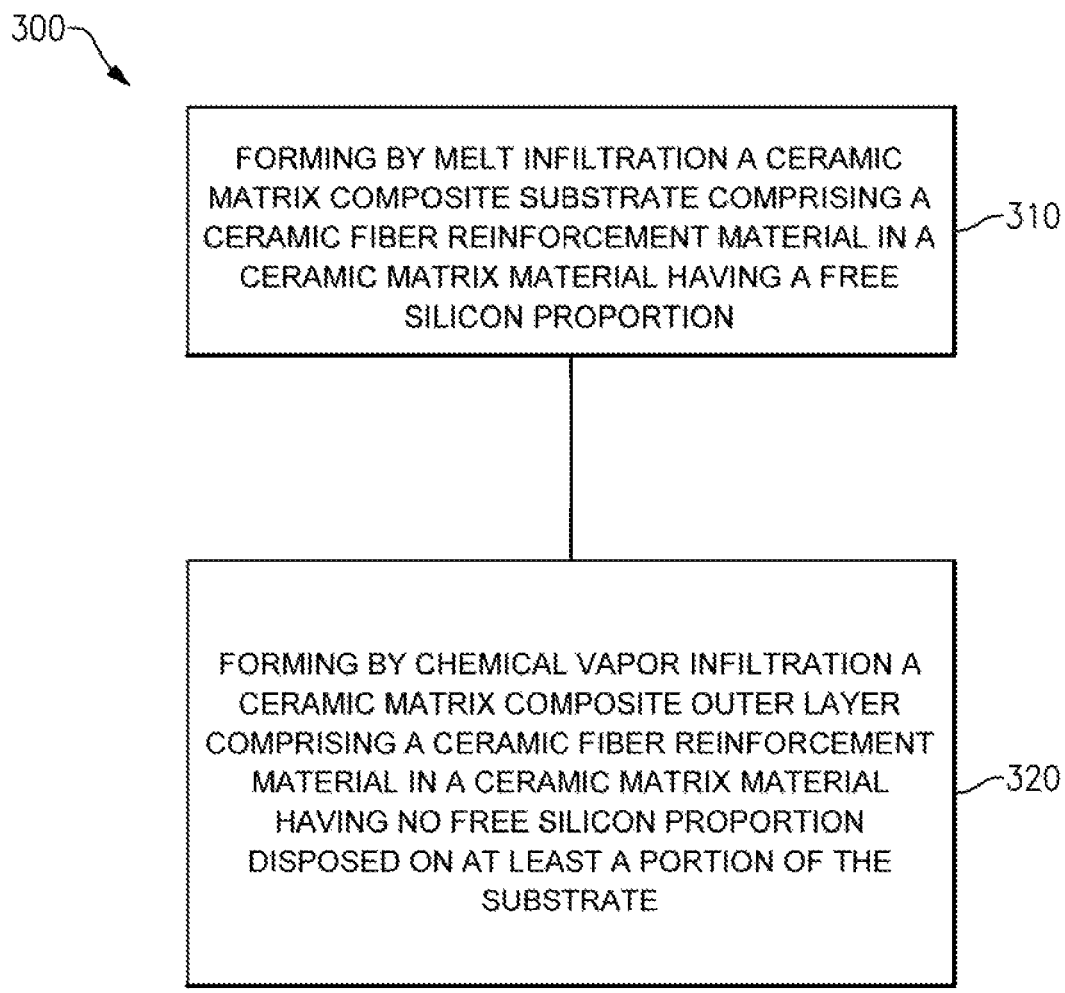
FIG. 6 is a flowchart of a method for forming a CMC article having a ceramic matrix composite substrate and a ceramic matrix composite outer layer in accordance with aspects of the present disclosure.

FIG. 6 illustrates a method 300 for forming a ceramic matrix composite article. Method includes, at 310, forming by melt infiltration a ceramic matrix composite substrate comprising a ceramic fiber reinforcement material in a ceramic matrix material having a free silicon proportion, and at 320, forming by chemical vapor infiltration a ceramic matrix composite outer layer comprising a ceramic fiber reinforcement material in a ceramic matrix material having no free silicon proportion disposed on at least a portion of the substrate.

In other embodiments of the present disclosure, a ceramic matrix composite article may include a ceramic matrix composite substrate comprising a ceramic fiber reinforcement material in a ceramic matrix material having a free silicon proportion, a ceramic matrix composite outer layer comprising a ceramic fiber reinforcement material in a ceramic matrix material having essentially no free silicon proportion disposed on an outer surface of at least a portion of the substrate.

In other embodiments of the present disclosure ceramic matrix composite article may include a ceramic matrix composite substrate comprising ceramic fiber reinforcement material in a ceramic matrix material having a first creep resistance, and a ceramic matrix composite outer layer comprising ceramic fiber reinforcement material in a ceramic matrix material having a second creep resistance disposed on at least a portion of the substrate. The second creep resistance is greater than the first creep resistance.

It is to be understood that the above description is intended to be illustrative, and not restrictive. Numerous changes and modifications may be made herein by one of ordinary skill in the art without departing from the general spirit and scope of the disclosure as defined by the following claims and the equivalents thereof. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Also, the term "operably" in conjunction with terms such as coupled, connected, joined, sealed or the like is used herein to refer to both connections resulting from separate, distinct components being directly or indirectly coupled and components being integrally formed (i.e., one-piece, integral or monolithic). Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the disclosure has been described in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments have been described, it is to be understood that aspects of the disclosure may include only some of the described embodiments. Accordingly, the disclosure is not to be seen as limited by the foregoing description, but is only limited by the scope of the appended claims.

This written description uses examples, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:
1. A ceramic matrix composite article comprising:
   a melt infiltration ceramic matrix composite substrate comprising a ceramic fiber reinforcement material in a ceramic matrix material having a free silicon proportion;
   a chemical vapor infiltration ceramic matrix composite outer layer comprising a ceramic fiber reinforcement material in a ceramic matrix material having no free silicon disposed on an outer surface of at least a portion of said substrate.

2. The ceramic matrix composite article of claim 1 wherein said substrate comprises generally silicon carbide and free silicon, and said outer layer comprises generally pure silicon carbide.

3. The ceramic matrix composite article of claim 1 wherein said substrate comprises generally silicon carbide and free silicon, and said outer layer comprises generally silicon carbide and free carbon.

4. The ceramic matrix composite article of claim 1 wherein said substrate comprises a first creep resistance, said outer layer comprises a second creep resistance, and said second creep resistance being greater than said first creep resistance.

5. The ceramic matrix composite article of claim 1 wherein said substrate comprises a first temperature capability, said outer layer comprises a second temperature capability, and said second temperature capability being greater than said first temperature capability.

6. The ceramic matrix composite article of claim 1 wherein said substrate comprises a prepreg melt infiltration ceramic matrix composite substrate.

7. The ceramic matrix composite article of claim 1 wherein said substrate comprises a slurry cast melt infiltration ceramic matrix composite substrate.

8. The ceramic matrix composite article of claim 1 wherein said ceramic fiber reinforcement material of said substrate comprises a plurality of unidirectional reinforcement fibers.

9. The ceramic matrix composite article of claim 1 wherein said ceramic fiber reinforcement material of said outer layer comprises at least one layer of unidirectional reinforcement fibers.

10. The ceramic matrix composite article of claim 1 wherein said ceramic fiber reinforcement material of said outer layer comprises a plurality of layers of unidirectional reinforcement fibers.

11. The ceramic matrix composite article of claim 1 wherein said ceramic fiber reinforcement of said outer layer comprises one or more layers of woven reinforcement fibers.

12. The ceramic matrix composite article of claim 1 wherein said ceramic fiber reinforcement material of said substrate is the same as said ceramic fiber reinforcement material of said outer layer.

13. The ceramic matrix composite of claim 1 wherein the CVI composite surface layer is further infiltrated with an oxide material.

14. The ceramic matrix composite article of claim 1 further comprising an environmental barrier layer disposed on said outer layer.

15. The ceramic matrix composite article of claim 1 wherein said article is operable at a temperature over 2,400 degrees Fahrenheit.

16. The ceramic matrix composite article of claim 1 wherein said article comprises a turbine component.

* * * * *